US008591752B2

(12) United States Patent
Abe et al.

(10) Patent No.: US 8,591,752 B2
(45) Date of Patent: Nov. 26, 2013

(54) PLASMA PROCESSING METHOD (75) Inventors: Takahiro Abe, Kudamatsu (JP); Takeshi Shimada, Hikari (JP); Atsushi Yoshida, Kudamatsu (JP); Kentaro Yamada, Shunan (JP); Daisuke Fujita, Kudamatsu (JP)

(73) Assignee: Hitachi High Technologies Corporation, Tokyo (JP)

( * ) Notice: Subject to any disclaimer, the term of this patent is extended or adjusted under 35 U.S.C. 154(b) by 96 days.

(21) Appl. No.: 13/399,030

(22) Filed: Feb. 17, 2012

(65) Prior Publication Data

US 2013/0146563 A1 Jun. 13, 2013

(30) Foreign Application Priority Data

Dec. 7, 2011 (JP) ................... 2011-267454

(51) Int. Cl.
*B44C 1/22* (2006.01)
*B08B 9/00* (2006.01)

(52) U.S. Cl.
USPC .................. 216/22; 216/58; 216/67; 134/1.1; 134/22.1; 134/26; 438/905

(58) Field of Classification Search
USPC .................. 216/22, 58, 67; 134/1.1, 22.1, 26; 438/905
See application file for complete search history.

(56) References Cited

U.S. PATENT DOCUMENTS

| 2004/0200498 | A1* | 10/2004 | Wang et al. ............... 134/1.1 |
| 2005/0239286 | A1* | 10/2005 | Wu et al. ............... 438/637 |
| 2005/0266271 | A1* | 12/2005 | Tsuchiya et al. ............... 428/810 |
| 2006/0191555 | A1* | 8/2006 | Yoshida et al. ............... 134/1.1 |
| 2011/0114130 | A1* | 5/2011 | Kang et al. ............... 134/22.1 |
| 2011/0308544 | A1 | 12/2011 | Osada et al. |

FOREIGN PATENT DOCUMENTS

| JP | 2000-12515 | 1/2000 |
| JP | 2002-359234 | 12/2002 |
| KR | 2003-0085879 | 11/2003 |
| KR | 10-2004-0074083 | 8/2004 |
| WO | WO 03/051498 | 6/2003 |
| WO | WO 2010/084909 | 7/2010 |

OTHER PUBLICATIONS

Korean Official Action dated Feb. 7, 2013, for KR Application No. 10-2012-0007301.

* cited by examiner

*Primary Examiner* — Shamim Ahmed
(74) *Attorney, Agent, or Firm* — Antonelli, Terry, Stout & Kraus, LLP (57) ABSTRACT A method for plasma-etching a magnetic film and plasma-cleaning, in which deposits in an etching processing chamber are efficiently removed while corrosion of a wafer is suppressed, is provided. A plasma processing method for plasma-etching a to-be-processed substrate having a magnetic film in an etching processing chamber includes the steps of plasma-etching the magnetic film using a first gas not containing chlorine, transferring out the to-be-processed substrate from the etching processing chamber, first plasma-cleaning of the etching processing chamber using a second gas containing chlorine, and second plasma-cleaning using a third gas containing hydrogen after the first plasma cleaning.

7 Claims, 7 Drawing Sheets

PLASMA PROCESSING METHOD

BACKGROUND OF THE INVENTION

The present invention relates to a plasma processing method using a plasma processing apparatus. More particularly, the invention relates to a plasma processing method for plasma-etching a magnetic film.

With an increase in an amount of information in recent years, electronic equipment is required to be low in power consumption and memories are required to be fast in operation and non-volatile. DRAMs (Dynamic Random Access Memories), flush memories, and the like, which utilize accumulation of electric charges, can be listed as memories which are used at present. The DRAMs are used as a main memory of a computer and are volatile memories which lose memory when the power supply is turned off. Further, in order to hold data during operation, rewrite is necessary in a certain interval and power consumption is large. Though flush memories are non-volatile memories, on the other hand, write time of information is in the order of micro seconds and long. As non-volatile memories which are free from these drawbacks and operate with low power consumption at a high speed, an application of MRAMs (Magnetic Random Access Memories) is expected.

The MRAMs are the memories that utilize the changes of resistance values depending on the directions of magnetization and in their fabrications a micromachining technology with dry etching of a magnetic film containing elements such as Fe, Co, and/or Ni formed on a substrate using a mask produced by lithography are required.

As for methods of dry etching of a magnetic film there are a method using ion beam etching and a method using plasma etching; plasma etching, in particular, has been widely used in fabrication of semiconductor devices and is advantageous in mass productivity because a substrate having a large diameter can be uniformly plasma-etched.

As for etching methods of a magnetic film using plasma etching there are a method that utilizes formation of chlorides of the magnetic film by $Cl_2$ plasma converted from a $Cl_2$ gas into plasma and a method that utilizes formation of metal carbonyls of the magnetic film by CO-containing plasma converted from a CO-containing gas such as a mixed gas of a CO gas and an $NH_3$ gas or a $CH_3OH$ gas into plasma.

On the other hand, as for a plasma-cleaning method JP-A-2000-012515 discloses a cleaning method for preventing generation of contaminating matters by reducing deposits inside a chamber using a mixed gas of a boron trichloride ($BCl_3$) gas and a chlorine ($Cl_2$) gas or a mixed gas of a boron trichloride ($BCl_3$) gas and a hydrogen chloride (HCl) gas as a cleaning gas after a laminated film of aluminum (Al) and titanium nitride (TiN) is etched.

Also, JP-A-2002-359234 discloses a method in which metals such as iron (Fe) and/or copper (Cu) attached to an inner surface of a plasma processing chamber are removed by plasma cleaning using a fluorinated diketone gas and then organic materials attached to the inner surface of the plasma processing chamber are removed by oxygen ($O_2$)-based plasma cleaning.

In the plasma cleaning method disclosed in JP-A-2000-012515, however, chlorine remains in the etching processing chamber after cleaning and, when magnetic films are etched in succession, the chlorine component remaining in the etching processing chamber is implanted into the magnetic films, which are material to be etched, so that magnetic characteristics degrade. Also, when a wafer having the magnetic films is exposed to the atmosphere after etching while chlorine remaining in the etching processing chamber stays on the wafer, chlorine staying on the wafer having the magnetic films reacts with moisture in air on the surface of the wafer having the magnetic films to produce hydrochloric acid so that a problem arises that the surface of the wafer having the magnetic films is corroded.

Also, in the plasma cleaning method disclosed in JP-A-2002-359234, since cleaning gas contains fluorine (F), fluorine (F) reacts with aluminum (Al) of base material of an inner wall of an etching processing chamber or anodized aluminum of a protective film of an inner wall of a processing chamber to produce aluminum fluoride of low volatility, which deposits in the etching processing chamber, and a problem of generation of contaminating matters due to the aluminum fluoride deposition arises.

SUMMARY OF THE INVENTION

It is, therefore, an object of the present invention to provide a plasma processing method for plasma etching of a magnetic film and plasma cleaning which can suppress corrosion of a wafer having a magnetic film and can efficiently remove deposits inside an etching processing chamber in which a magnetic film is plasma-etched.

The present invention provides a plasma processing method for plasma-etching a to-be-processed substrate having a magnetic film in an etching processing chamber including the steps of plasma-etching the magnetic film using a first gas not containing chlorine; transferring out the to-be-processed substrate having the magnetic film plasma-etched from the etching processing chamber; and plasma-cleaning the etching processing chamber, which further includes the steps of first plasma-cleaning to plasma-clean using a second gas containing chlorine; and second plasma-cleaning to plasma-clean using a third gas containing hydrogen after the first plasma-cleaning.

Also, the present invention provides a plasma processing method for plasma-etching a to-be-processed substrate having a magnetic film in an etching processing chamber using an inductively coupled plasma etching apparatus having a Faraday shield, including the steps of plasma-etching the magnetic film using a first gas not containing chlorine; transferring out the to-be-processed substrate having the magnetic film plasma-etched from the etching processing chamber; and plasma-cleaning the etching processing chamber, which further includes the steps of first plasma-cleaning to plasma-clean using a second gas containing chlorine; and second plasma-cleaning to plasma-clean using a third gas containing hydrogen after the first plasma cleaning; wherein the second plasma-cleaning is performed while applying to the Faraday shield a voltage lower than a voltage applied to the Faraday shield during the first plasma-cleaning.

Further, the invention provides an etching processing method of a magnetic film material including a first step of etching a to-be-processed substrate of a magnetic film material by a first gas not containing chlorine; a second step of transferring out the to-be-processed substrate; a third step of producing plasma by a second gas containing chlorine in an etching processing chamber; and a fourth step of producing plasma by a third gas containing hydrogen in an etching processing chamber; wherein each of the first to fourth steps is performed in a described sequence or, after the first and second steps are repeatedly performed, the third and fourth steps are performed.

Owing to the above-described constructions of the present invention, a magnetic film can be plasma-etched and plasma cleaning capable of suppressing corrosion of a wafer having a magnetic film thereon and efficiently removing deposits inside the etching processing chamber in which a magnetic film is plasma-etched can be executed.

Other objects, features, and advantages of the invention will become apparent from the following description of the embodiments of the invention taken in conjunction with the accompanying drawings.

DESCRIPTION OF THE EMBODIMENTS

The present invention relates to a plasma processing method involving the steps of plasma etching a magnetic film by using a plasma etching apparatus and a gas which does not contain chlorine, transferring out a wafer for which plasma etching of the magnetic film is completed from an etching processing chamber, and then plasma cleaning the aforementioned etching processing chamber; the plasma cleaning that constitutes the present invention includes the steps of removing deposits containing the magnetic film by plasma using a chlorine gas and removing chlorine remaining in the aforementioned etching processing chamber by plasma using a gas containing hydrogen.

Each of the embodiments of the present invention is hereinafter explained.

Embodiment 1

Figure 1:
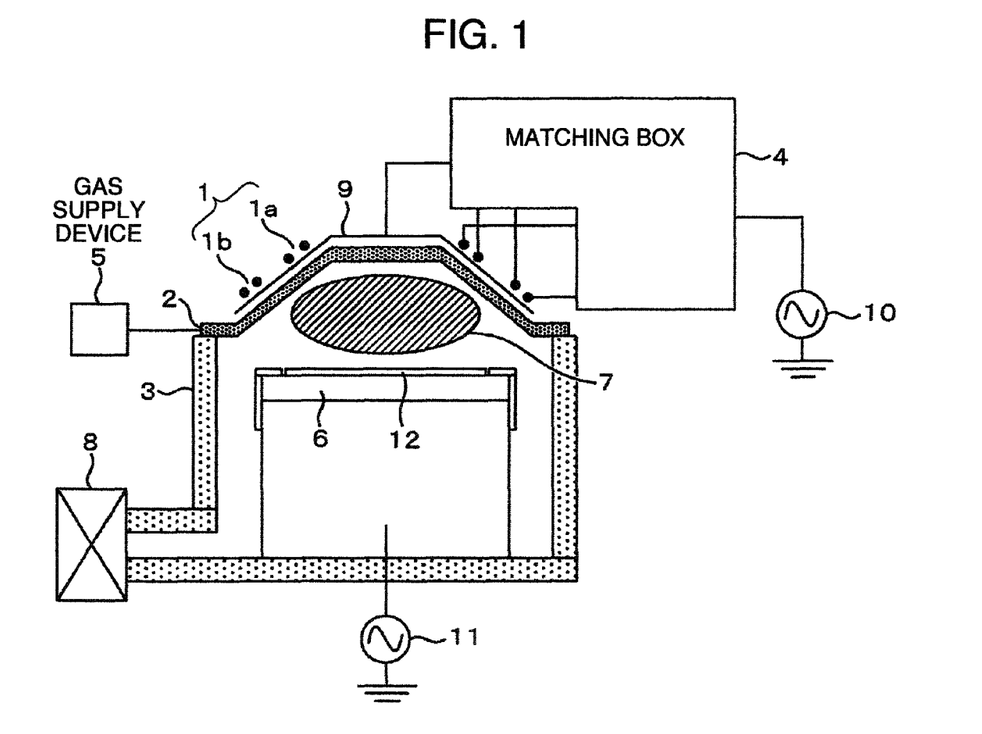
FIG. 1 is a sectional diagram showing a plasma etching apparatus according to an embodiment of the present invention.

First, a plasma etching apparatus for which the present invention is applied is explained with reference to FIG. 1.

An etching processing chamber comprises a discharge unit 2 which forms a plasma production unit and is made of non-conductive material such as quartz ($SiO_2$) or ceramic ($Al_2O_3$) and a plasma processing unit 3 on which a wafer 12 as a to-be-processed substrate is mounted and in which an electrode 6 supplied with radio frequency bias power is arranged. Further, the plasma processing unit 3 is grounded and the electrode 6 is arranged in the plasma processing unit 3 through an insulating material. Outside the discharge unit 2, an induction antenna 1 comprising a first induction antenna 1a and a second induction antenna 1b, a Faraday shield 9 which is arranged between the induction antenna 1 and the discharge unit 2 and acts as a capacitively-coupling antenna, and a first radio frequency power supply 10 for supplying radio frequency power to the induction antenna 1 for producing plasma through a matching box 4 are provided.

In this plasma etching apparatus suppression of attachment of reaction products to the discharge unit 2 and their removal are possible by applying a radio frequency voltage to the Faraday shield 9 from the first radio frequency power supply 10 through the matching box 4.

While the inside of the etching processing chamber is supplied with a process gas from a gas supply device 5, it is evacuated to a predetermined pressure by an exhaust device 8.

The gas supply device 5 supplies the process gas into the etching processing chamber and plasma 7 is produced inside the etching processing chamber by an effect of induced magnetic field generated by the induction antenna 1. Also, in order to draw ions in the plasma 7 to the wafer 12, a radio frequency bias voltage is applied to the electrode 6 by a second radio frequency power supply 11.

Figure 2:
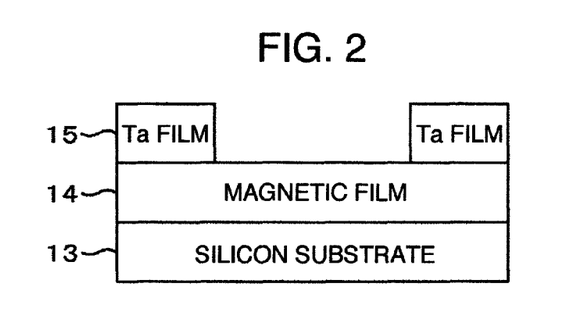
FIG. 2 is a diagram showing a structure of a film of a wafer 12 used in an embodiment of the present invention.

Next, a structure of a film on the wafer 12 used in the embodiment of the present invention is shown in FIG. 2. On a silicon substrate 13 a magnetic film 14 of nickel iron (NiFe) is formed. Also, a tantalum (Ta) film 15 as a mask is formed into a pattern on the magnetic film 14.

Incidentally, although nickel iron (NiFe) is used as the magnetic film in the present embodiment, it is not limited thereto; it may be of iron (Fe), cobalt iron (CoFe), nickel iron cobalt (NiFeCo), or the like. Namely, it may be material which contains at least one of iron (Fe), cobalt (Co), and nickel (Ni).

Also, even though tantalum (Ta) is used for the mask in the present embodiment, the present invention is not limited to tantalum (Ta) but may use a hard mask other than tantalum (Ta), a resist mask, or a laminated mask of a resist mask and a hard mask.

Figure 3:
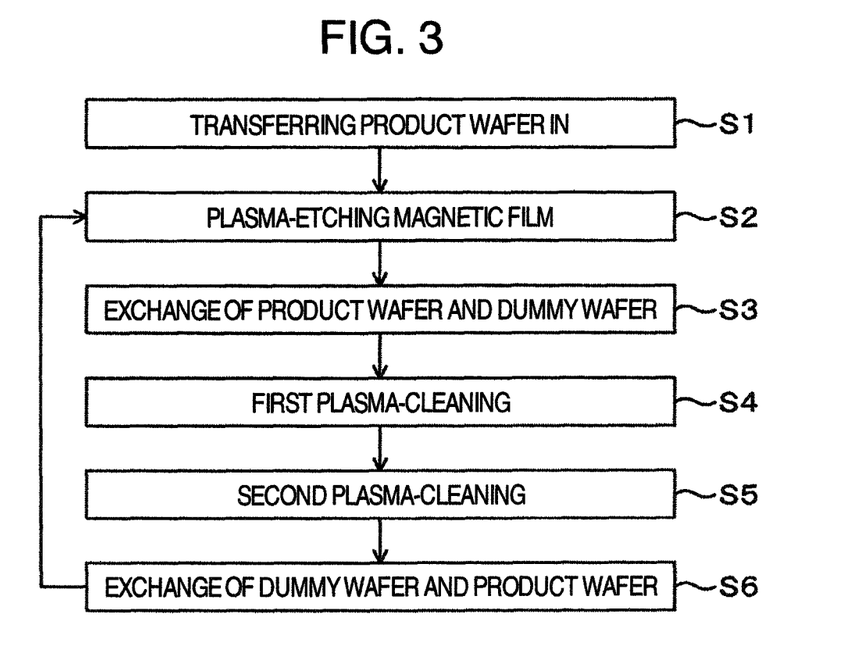
FIG. 3 is a flowchart of plasma processing according to an embodiment of the present invention.

Next, a plasma processing method according to the present embodiment is explained with reference to a flow of plasma processing shown in FIG. 3.

First, the wafer 12 shown in FIG. 2 is mounted on the electrode 6 in the etching processing chamber by a transfer device (not shown) (S1).

Next, the magnetic film 14 on the wafer 12 is subjected to plasma etching (S2) using the tantalum (Ta) film 15 as a mask at the etching condition of a CO gas flow rate of 60 ml/min., a processing pressure of 0.3 Pa, radio frequency power for plasma production of 1,200 W, radio frequency bias power applied to the electrode 6 of 500 W, and a radio frequency voltage applied to the Faraday shield 9 (hereinafter referred to "FSV") of 100 V as shown in Table 1. Here, in this embodiment the gas for etching the magnetic film 14 is a CO gas but it may be a mixed gas of a CO gas and an $NH_3$ gas, a $CO_2$ gas, a $CH_3OH$ gas, a $C_2H_5OH$ gas, a $C_3H_7OH$ gas, or a $CH_3COCH_3$ gas. In other words, as for the present invention it may be a gas which does not contain chlorine.

TABLE 1

| CO gas (ml/min) | processing pressure (Pa) | radio frequency power for plasma production (W) | radio frequency bias power (W) | FSV (V) |
|---|---|---|---|---|
| 60 | 0.3 | 1,200 | 500 | 100 |

Next, the wafer 12 for which plasma etching of the magnetic film 14 is completed is transferred out from the etching processing chamber by a transfer device (not shown) and a dummy wafer is then mounted onto the electrode 6 in the etching processing chamber (S3). While transferring the wafer 12 for which plasma etching of the magnetic film 14 is completed out from the etching processing chamber is necessary in this invention, however, transferring a dummy wafer into the etching processing chamber is not essential.

Next, deposits containing nickel and iron that are deposited inside the etching processing chamber are subjected to plasma cleaning at a first plasma cleaning condition of a $Cl_2$ gas flow rate of 100 ml/min, a processing pressure of 1.0 Pa, radio frequency power for plasma production of 1,800 W, radio frequency bias power supplied to the electrode 6 of 100 W, and a FSV of 600V as shown in Table 2 (S4).

TABLE 2

| $Cl_2$ gas (ml/min) | processing pressure (Pa) | radio frequency power for plasma production (W) | radio frequency bias power (W) | FSV (V) |
|---|---|---|---|---|
| 100 | 1.0 | 1,800 | 100 | 600 |

The reasons why the deposits containing nickel, iron, and tantalum deposited inside the etching processing chamber can be removed by the first plasma cleaning follow.

Figure 4:
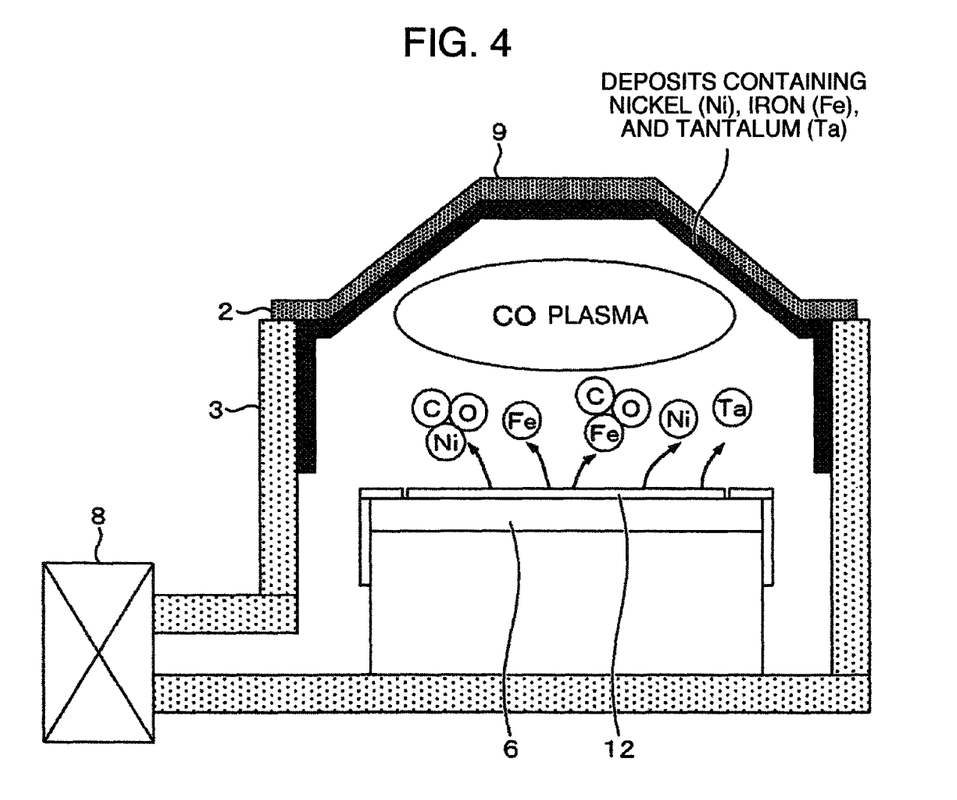
FIG. 4 is a diagram showing a state inside an etching processing chamber during plasma etching of a magnetic film.

During plasma etching of the magnetic film 14, nickel (Ni) and iron (Fe) of the magnetic film 14, which are materials to be etched, react with excited active species in the CO gas, forming thereby $Ni(CO)_x$ and $Fe(CO)_x$ of metal carbonyls having high vapor pressures. Also with high ion incidence energies, nickel (Ni), iron (Fe), and tantalum (Ta), which is mask material, are knocked off as simple substances. Consequently, deposits containing nickel, iron, and tantalum adhere to the inner wall of the discharge unit 2 made of ceramic ($Al_2O_3$) and its periphery as shown in FIG. 4.

When the amount of the adhering deposits becomes great, they peel off and fall from the inner wall of the etching processing chamber to become contaminating matters. Also, when deposits adhere to the inner wall of the discharge unit 2, plasma conditions change and changes in etching performances such as an etching rate, uniformity, and etch profiles over time are induced. Therefore, in order to obtain stable etching performances, it is required to remove the deposits.

Figure 5:
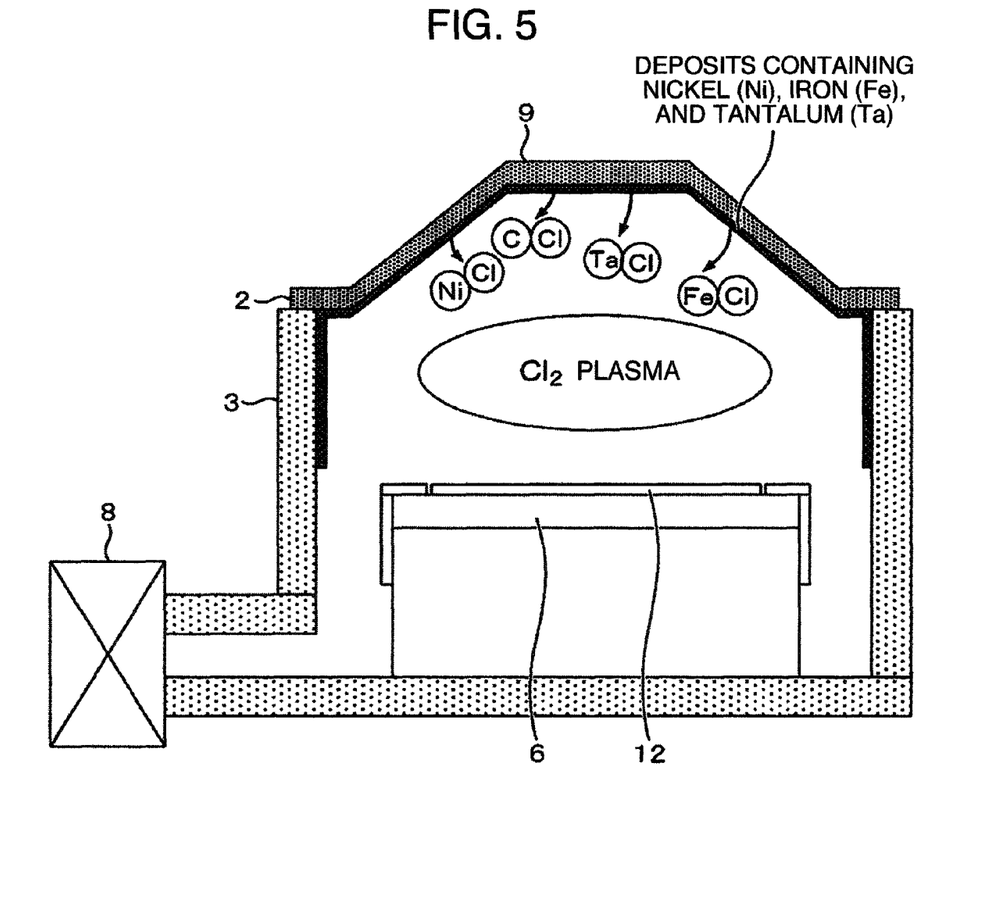
FIG. 5 is a diagram showing a state inside the etching processing chamber during first plasma cleaning.

When plasma cleaning inside the etching processing chamber is performed by plasma using a chlorine gas to remove the deposits, the deposits containing nickel (Ni), iron (Fe), and tantalum (Ta) which adhere to the inner wall of the etching processing chamber react with chlorine ($Cl_2$) radicals to become chlorides and are removed.

Because the above-described deposits are comprised by the magnetic film 14 which is material to be etched, removal of the deposits inside the etching processing chamber is also possible using plasma of the carbon monoxide (CO) gas that is used for plasma etching of the magnetic film 14 as for the first plasma cleaning.

Plasma etching rates of magnetic materials with gases other than gases containing chlorine are, however, extremely low and efficient removal of the reaction products in a short time is difficult. When the plasma etching rates of the magnetic film by a chlorine gas and by a carbon monoxide gas are compared with each other, for example, the plasma etching rate of the magnetic film by a carbon monoxide gas is fairly lower than that by a chlorine gas as shown in Table 3. This characteristic is attributed to the following. Vapor pressures of chlorides of iron or nickel ($FeCl_x$ or $NiCl_x$) are extremely high and they are easy to evaporate. On the other hand, vapor pressures of metal carbonyls are high and they are easy to evaporate but the etching rate of the magnetic film is lower because carbon-based etching inhibitors are formed simultaneously.

TABLE 3

| | gas flow rate (ml/min) | processing pressure (Pa) | radio frequency power for plasma production (W) | radio frequency bias power (W) | FSV (V) | NiFe etching rate (nm/min) |
|---|---|---|---|---|---|---|
| CO | 60 | 0.3 | 1,200 | 500 | 100 | 12.4 |
| $Cl_2$ | 60 | 0.3 | 1,200 | 500 | 100 | 86.0 |

For such the reasons, plasma using a chlorine gas is employed for the first plasma cleaning of the present embodiment.

Further, although the chlorine ($Cl_2$) gas is used as the gas for the first plasma cleaning in the present embodiment, similar effects to the present embodiment can be obtained by using a boron trichloride ($BCl_3$) gas or a mixed gas of a chlorine ($Cl_2$) gas and a boron trichloride ($BCl_3$) gas. Namely, as the first plasma cleaning gas a gas containing chlorine may be used.

Next, when a magnetic film 14 of a subsequent wafer 12 is plasma-etched following completion of the first plasma cleaning in the etching processing chamber which is subjected to the first plasma cleaning, a chlorine component is driven into the magnetic film which is material to be etched since aluminum chloride ($Al_xCl_x$), for example, produced by reacting aluminum (Al) contained in the material of the discharge unit 2 with chlorine remaining in the etching processing chamber after the first plasma cleaning or a trace of chlorine remaining in the etching processing chamber adheres to the inner wall of the etching processing chamber, so that magnetic performances of semiconductor devices fabricated from the wafer 12 would be degraded. In addition, when the wafer 12 is exposed to the atmosphere while a chlorine component remains on the wafer 12 for which plasma etching of the magnetic film 14 is completed, moisture in air and the residual chlorine component react with each other to form hydrochloric acid on the surface of the above-described wafer 12 and the above-described wafer 12 would be corroded.

Figure 6:
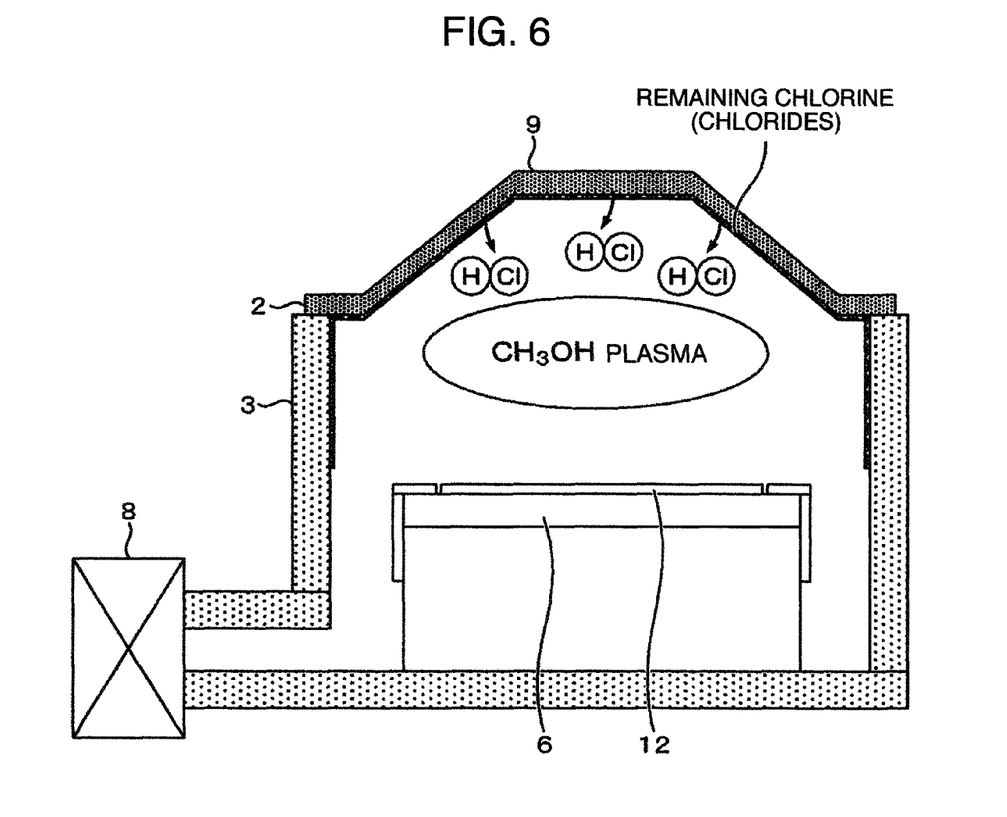
FIG. 6 is a diagram showing a state inside the etching processing chamber during second plasma cleaning.

Therefore, in the present embodiment, in order to remove chlorine remaining in the etching processing chamber caused by the first plasma cleaning following the first plasma cleaning, the inside of the etching processing chamber is plasma-cleaned at a second plasma cleaning condition of a $CH_3OH$ gas flow rate of 100 ml/min, a processing pressure of 1.0 Pa, radio frequency power for plasma production of 1,800 W, radio frequency bias power supplied to the electrode 6 of 100 W, and a FSV of 600V as shown in Table 4 (S5).

TABLE 4

| $CH_3OH$ gas (ml/min) | processing pressure (Pa) | radio frequency power for plasma production (W) | radio frequency bias power (W) | FSV (V) |
|---|---|---|---|---|
| 100 | 1.0 | 1,800 | 100 | 100 |

When the second plasma cleaning is applied to the etching processing chamber for which the first plasma cleaning has been performed, a hydrogen component generated from a methanol ($CH_3OH$) gas plasma and the chlorine remaining inside the etching processing chamber for which the first plasma cleaning has been performed react with each other to produce hydrogen chloride (HCl) that is easy to evaporate so that the chloride component remaining inside the etching processing chamber, for which the first plasma cleaning has been performed, can be removed.

Further, because the FSV in the second plasma cleaning is lower than the FSV in the first plasma cleaning, plasma can be generated rather in a broader area than only near the inner wall of the discharge unit 2. Therefore, the chlorine component remaining in the whole area of the etching processing chamber can be removed.

Incidentally, although methanol ($CH_3OH$) is used in the present embodiment as a gas for the second plasma cleaning, similar effects can be obtained by using hydrogen ($H_2$), methane ($CH_4$), ethane ($C_2H_6$), propane ($C_3H_8$), butane ($C_4H_{10}$), ethanol ($C_2H_5OH$), propanol ($C_3H_7OH$), acetone ($CH_3COCH_3$), ammonia ($NH_3$), and water ($H_2O$). In other words, a gas containing hydrogen may be used as a gas for the second plasma cleaning.

Next, after the second plasma cleaning, the dummy wafer mounted on the electrode 6 is transferred out from the etching processing chamber by the transfer device (not shown) and a next wafer 12 is mounted on the electrode 6 in the etching processing chamber by the transfer device (not shown) (S6).

A magnetic film of the wafer 12 mounted on the electrode 6 is then subjected to plasma etching at the condition shown in Table 1 (S2).

The process flow described above is repeated until plasma etching of the magnetic films 14 of a predetermined number of wafers 12 is completed.

According to the present embodiment described above, in plasma etching of a magnetic film using a gas which does not contain chlorine, deposits on an inner wall of an etching processing chamber resulting from reaction products produced in the plasma etching of the magnetic film and corrosion of wafers for which the plasma etching of the magnetic film is completed can be prevented without deteriorating magnetic performances of semiconductor devices fabricated from the wafers for which the plasma etching of the magnetic film is conducted. Production of contaminating matters can also be suppressed and changes of plasma etching performances with time can be suppressed.

Embodiment 2

In the above-explained plasma processing method of Embodiment 1 of the present invention, when a large amount of carbon-based deposits are generated during the plasma etching of the magnetic film, a load on the first plasma cleaning in the step S4 becomes great and a processing time of the first plasma cleaning increases. This is because a gas containing chlorine is used as the gas for the first plasma cleaning and a removal rate of the carbon-based deposits is not too high.

Therefore, associated with the present embodiment an explanation is given for a plasma processing method in which the carbon-based deposits can be effectively removed without increasing the processing time of the first plasma cleaning even when the amount of the carbon-based deposits deposited inside the etching processing chamber after the plasma etching of the magnetic film is great while similar effects to those of Embodiment 1 can be obtained.

Figure 7:
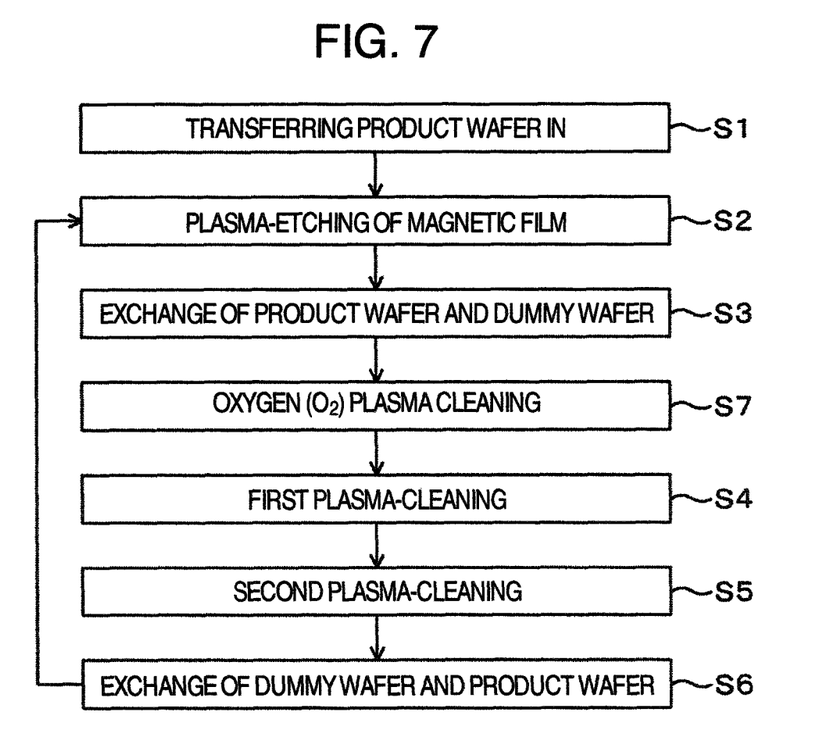
FIG. 7 is a flowchart of plasma processing according to an embodiment of the present invention.

The present embodiment of the invention is different from Embodiment 1 only in that third plasma cleaning which is conducted after the step of S3 is performed to the etching processing chamber (S7) as shown in FIG. 7. Since each of the steps of S1 to S6 shown in FIG. 7 executes a processing similar to each of the steps of S1 to S6 in Embodiment 1, the explanation of each of the steps of S1 to S6 in the present embodiment is omitted. Also, because a plasma etching apparatus and a wafer 12 used in the plasma processing of the present embodiment are similar to those in Embodiment 1, their explanations are omitted.

Figure 8:
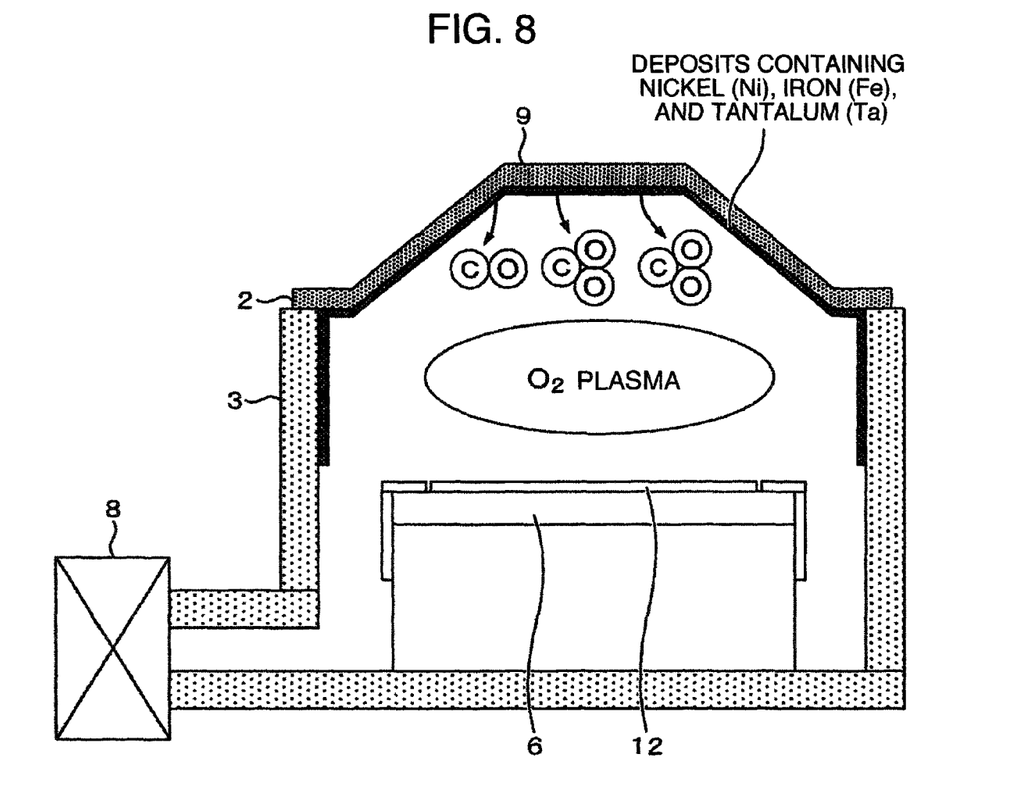
FIG. 8 is a diagram showing a state inside the etching processing chamber during third plasma cleaning.

After each of the steps of S1 to S3 is performed, the plasma processing method of the present embodiment executes plasma cleaning (S7) for the inside of the etching processing chamber at a third plasma cleaning condition of an $O_2$ gas flow rate of 100 ml/min, a processing pressure of 1.0 Pa, radio frequency power for plasma production of 1,800 W, radio frequency bias power supplied to the electrode 6 of 100 W, and a FSV of 600V as shown in Table 5 to remove carbon-based deposits deposited in the etching processing chamber during plasma etching of the magnetic film 14.

TABLE 5

| $O_2$ gas (ml/min) | processing pressure (Pa) | radio frequency power for plasma production (W) | radio frequency bias power (W) | FSV (V) |
|---|---|---|---|---|
| 100 | 1.0 | 1,800 | 100 | 600 |

When the third plasma cleaning is applied to the etching processing chamber, oxygen radicals generated from the oxygen ($O_2$) gas plasma react with the carbon-based deposits to produce volatile compounds such as carbon monoxide (CO) and carbon dioxide ($CO_2$) so that the carbon-based deposits can be removed.

Next, after the third plasma cleaning is performed each of the steps of S4 to S6 is conducted. Then, each of the steps is repeated in the sequence of S2, S3, S7, S4, S5, and S6 until plasma etching of the magnetic films 14 of a predetermined number of wafers 12 is completed.

According to the present embodiment described above, not only the effects similar to those of Embodiment 1 can be obtained, carbon-based deposits can, further, be removed without increasing the processing time of the first plasma cleaning even when the amount of the carbon-based deposits deposited inside the etching processing chamber after the plasma etching of the magnetic film is large.

Even though in Embodiments 1 and 2 explanations are given on an inductively coupled plasma etching apparatus as a plasma etching apparatus by way of example, the present invention is not limited thereto; it can be applied to a microwave plasma etching apparatus, a capacitively coupled plasma etching apparatus, a helicon plasma etching apparatus, and so forth.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method for plasma-etching a to-be-processed substrate having a magnetic film in an etching processing chamber, comprising the steps of:
    plasma-etching said magnetic film using a first gas not comprising chlorine;
    transferring out said to-be-processed substrate having said magnetic film plasma-etched from said etching processing chamber; and
    plasma-cleaning said etching processing chamber, said plasma-cleaning further comprising the steps of:
        first plasma-cleaning to plasma-clean using a second gas comprising chlorine; and second plasma-cleaning to plasma-clean using a third gas comprising hydrogen after said first plasma-cleaning.

2. The plasma processing method according to claim 1, wherein said plasma-cleaning further comprises a step of third plasma-cleaning to plasma-clean using an oxygen gas before said first plasma-cleaning.

3. The plasma processing method according to claim 1, wherein said second gas is any one of a chlorine gas, a boron trichloride gas, and a mixed gas of a chlorine gas and a boron trichloride gas.

4. The plasma processing method according to claim 1, wherein said third gas comprising hydrogen is a methanol gas.

5. The plasma processing method according to claim 1, wherein said magnetic film is a film containing at least one of iron, cobalt, and nickel.

6. A plasma processing method for plasma-etching a to-be-processed substrate having a magnetic film in an etching processing chamber using an inductively coupled plasma etching apparatus having a Faraday shield, comprising the steps of:
   plasma-etching said magnetic film using a first gas not comprising chlorine;
   transferring out said to-be-processed substrate having said magnetic film plasma-etched from said etching processing chamber; and
   plasma-cleaning said etching processing chamber, said plasma-cleaning further comprising the steps of:
      first plasma-cleaning to plasma-clean using a second gas comprising chlorine; and
      second plasma-cleaning to plasma-clean using a third gas comprising hydrogen after said first plasma-cleaning, said second plasma-cleaning being performed while applying to said Faraday shield a voltage lower than a voltage applied to said Faraday shield during said first plasma-cleaning.

7. An etching processing method of a magnetic film material comprising:
   a first step of etching a to-be-processed substrate of a magnetic film material by a first gas not comprising chlorine;
   a second step of transferring out said to-be-processed substrate;
   a third step of producing plasma by a second gas comprising chlorine in an etching processing chamber; and
   a fourth step of producing plasma by a third gas comprising hydrogen in an etching processing chamber;
   wherein each of said first to fourth steps is performed in a described sequence or, after said first and second steps are repeatedly performed, said third and fourth steps are performed.

* * * * *